(12) United States Patent
Stahlhut et al.

(10) Patent No.: US 7,903,417 B2
(45) Date of Patent: *Mar. 8, 2011

(54) ELECTRICAL CIRCUIT ASSEMBLY FOR HIGH-POWER ELECTRONICS

(75) Inventors: Ronnie Dean Stahlhut, Bettendorf, IA (US); Clement Vanden Godbold, Rock Hill, SC (US); Jeffrey Gerald Hopman, Horace, ND (US); Kartheek Karna, Fargo, ND (US); James Arthur Springer, Casselton, ND (US); John Lopes Alves, Horace, ND (US); Lise Alves, legal representative, Horace, ND (US)

(73) Assignee: Deere & Company, Moline, IL (US)

( * ) Notice: Subject to any disclaimer, the term of this patent is extended or adjusted under 35 U.S.C. 154(b) by 31 days.

This patent is subject to a terminal disclaimer.

(21) Appl. No.: 11/869,006

(22) Filed: Oct. 9, 2007

(65) Prior Publication Data

US 2008/0247139 A1    Oct. 9, 2008

Related U.S. Application Data

(63) Continuation-in-part of application No. 11/545,633, filed on Oct. 10, 2006, now abandoned.

(51) Int. Cl.
*H05K 7/20* (2006.01)
*F28F 7/00* (2006.01)
*H01L 23/34* (2006.01)

(52) U.S. Cl. ......... 361/713; 361/709; 361/715; 361/719; 165/80.2; 165/80.3; 165/185; 257/712; 257/713; 257/722; 257/E23.103; 174/16.3; 174/16.1; 174/252

(58) Field of Classification Search ............... 361/704, 361/709, 710, 713, 715, 717, 719; 165/80.2, 165/80.3; 257/712–713, 722; 174/16.1, 174/16.3
See application file for complete search history.

(56) References Cited

U.S. PATENT DOCUMENTS

| 3,268,772 | A |   | 8/1966  | Kamei et al. |
| 3,868,770 | A | * | 3/1975  | Davis et al. ............ 29/837 |
| 4,811,165 | A |   | 3/1989  | Currier et al. |
| 4,859,808 | A | * | 8/1989  | Jeter et al. ............ 174/261 |
| 5,273,418 | A | * | 12/1993 | Kato et al. ............ 425/186 |
| 5,276,418 | A |   | 1/1994  | Klosowiak et al. |
| 5,467,251 | A |   | 11/1995 | Katchmar |

(Continued)

FOREIGN PATENT DOCUMENTS

GB    2352872    2/2001

OTHER PUBLICATIONS

Thermal Substrates: T-Chad. Web page [online]. © 2006 The Bergquist Company [first retrieved on Nov. 1, 2004] Retrieved from the Internet: Internet: <URL:http://www.bergquistcompany.com/ts_thermal_clad.cfm>.

(Continued)

*Primary Examiner* — Zachary M Pape

(57) ABSTRACT

An electrical circuit assembly includes an electrical circuit substrate having a first side; a heat sink including a metal base plate having a first side and a second side, and a plurality of fins extending from the second side; and a thermally conductive and electrically insulating adhesive directly interconnecting at least a portion of the first side of the electrical circuit substrate with the first side of the base plate.

20 Claims, 6 Drawing Sheets

U.S. PATENT DOCUMENTS

| | | | |
|---|---|---|---|
| 5,500,555 | A | 3/1996 | Ley |
| 5,548,481 | A * | 8/1996 | Salisbury et al. ............. 361/709 |
| 5,579,207 | A | 11/1996 | Hayden et al. |
| 5,616,888 | A | 4/1997 | McLaughlin et al. |
| 5,699,235 | A * | 12/1997 | Tsurumiya et al. ........... 361/803 |
| 6,046,906 | A | 4/2000 | Tseng |
| 6,061,243 | A | 5/2000 | Barnett et al. |
| 6,282,782 | B1 | 9/2001 | Biunno et al. |
| 6,320,748 | B1 * | 11/2001 | Roden et al. .................. 361/704 |
| 6,370,767 | B1 | 4/2002 | Solberg et al. |
| 6,377,462 | B1 | 4/2002 | Hajicek et al. |
| 6,442,027 | B2 * | 8/2002 | Sanada et al. ................. 361/704 |
| 6,655,017 | B1 | 12/2003 | Formwalt, Jr. et al. |
| 6,778,398 | B2 | 8/2004 | Wyland |
| 6,791,036 | B1 * | 9/2004 | Chen et al. .................... 174/257 |
| 7,006,355 | B2 * | 2/2006 | Wakabayashi et al. ....... 361/728 |
| 7,297,034 | B1 * | 11/2007 | Wieland et al. ............... 439/801 |
| 2001/0005051 | A1 * | 6/2001 | Takeuchi et al. .............. 257/712 |
| 2002/0018101 | A1 | 2/2002 | Beerling et al. |
| 2003/0227959 | A1 | 12/2003 | Balian et al. |
| 2004/0004818 | A1 | 1/2004 | Kawakita et al. |
| 2004/0055152 | A1 * | 3/2004 | Fraivillig ........................ 29/830 |
| 2005/0192392 | A1 * | 9/2005 | Kim et al. ...................... 524/436 |
| 2006/0171120 | A1 | 8/2006 | Mandel et al. |

OTHER PUBLICATIONS

Thermal Substrates: T-Chad. Web page [online]. © 2006 The Bergquist Company [first retrieved on Nov. 1, 2004] Retrieved from the Internet:<URL:http://www.bergquistcompany.com/ts_thermal_clad.cfm>.

isola A11 No-Flo Specialty Prepreg. Product Brochure [online]. [retrieved Nov. 1, 2010]. Retrieved from the Internet: <URL:http://www.isola-group.com/images/file/DSA11010710.pdf>.

isola A11 No-Flow. Product Brochure [online]. [retrieved Nov. 1, 2010]. Retrieved from the Internet: <URL:http://www.isola-group.com/images/file/ISOLAA11PGRev242208.pdf>.

isola No-Flo Specialty Prepreg FR406 LO-FLO. Product Brochure [online]. [retrieved Nov. 1, 2010]. Retrieved from the Internet: <URL:http://www.isola-group.com/images/file/DSFR406N010710.pdf>.

* cited by examiner

US 7,903,417 B2

ELECTRICAL CIRCUIT ASSEMBLY FOR HIGH-POWER ELECTRONICS

CROSS REFERENCES TO RELATED APPLICATIONS

This application is a continuation-in-part of U.S. application Ser. No. 11/545,633, entitled "Electrical circuit assembly for high-power electronics", filed Oct. 10, 2006 now abandoned.

FIELD OF THE INVENTION

The present invention relates to electrical circuit assemblies, and, more particularly, to electrical circuit assemblies carrying high-power electronic components.

BACKGROUND OF THE INVENTION

Traditionally, high-current electronic applications such as electric motor drive controllers require the use of large electronic components to handle the current. These components are not only physically large, but also generate a high amount of heat, and are often sold and mounted as through-hole devices (devices which must be mounted through holes in the circuit board and may need to be hand-soldered in place.) Through-hole devices cannot be easily mounted by automated methods such as pick-and-place machines, and require manual placement, which increases the manufacturing expense of the module. Even in applications where through-hole devices are replaced with easier to place surface mount devices, the assembly of the power devices, heat sink, bus capacitors, bus structure, external power connectors, signal interconnect, and enclosure requires a great deal of labor and multiple processes.

To deal with heat issues, a typical high-power application uses Insulated Metal Substrate Technology (also referred to as "IMST"), which bonds a circuit board to a flat metal plate to try to increase heat conduction away from the electronics. In order to dissipate more heat, the surface area of the plate must be increased (typically done by using a finned heat sink attached to the metal plate) or by using other technologies such as liquid-cooling to remove heat.

The Bergquist Company (http://www.bergquistcompany.com/ts_thermal_clad.cfm) manufactures thermally conductive interface materials using the IMST technology discussed above. A dielectric layer with minimal thermal resistance bonds a metal base layer to a circuit foil layer. A disadvantage of IMST is that the circuit and dielectric layers are bonded to a thin metal plate during the manufacturing process. While this thin metal plate provides some heat conduction, the only way to increase the heat conduction ability is to make the plate larger (wider and longer but still the same thickness), or by attaching it to a separate, larger finned metal heat sink. Small fins may be provided on the bottom of the IMST arrangement by cutting, bending, and/or welding fins on the bottom of an IMST plate. While this helps with the heat dissipation properties, it adds a costly manufacturing process.

Another disadvantage of an IMST approach is that the thermal resistance of the interface between the thin metal plate and the attached finned heat sink is high, which decreases the thermal efficiency.

The assignee of the present invention uses bonding technology similar to IMST in the manufacturing process for its FlexBox™ technology, bonding a flexible circuit to a flat metal plate (or plates)(see U.S. Pat. No. 6,655,017 B1, entitled "Electronic controller unit and method of manufacturing same"). A disadvantage of this type of arrangement is that a thin dielectric layer sandwiched between the circuit layer and the metal base layer must be baked (heat cured) in an oven, which requires an additional manufacturing step.

What is needed in the art is an electrical circuit assembly in which an electrical circuit may be more easily, quickly, and less expensively coupled with a heat sink with improved heat transfer characteristics to the heat sink.

SUMMARY OF THE INVENTION

In one form of the invention, an electrical circuit assembly includes an electrical circuit substrate having a first side; a heat sink including a metal base plate having a first side and a second side, and a plurality of fins extending from the second side; and a thermally conductive and electrically insulating adhesive directly interconnecting at least a portion of the first side of the electrical circuit substrate with the first side of the base plate.

In another form of the invention, an electronic control module includes a housing; a control board within the housing; and an electrical circuit assembly mounted to the housing. The electrical circuit assembly includes a electrical circuit substrate connected with the control board. The electrical circuit substrate includes a first side; a heat sink including a metal base plate having a first side and a second side, and a plurality of fins extending from the second side; and a thermally conductive and electrically insulating adhesive directly interconnecting at least a portion of the first side of the electrical circuit substrate with the first side of the base plate.

In yet another form of the invention, a method of manufacturing an electrical circuit assembly includes the steps of: providing an electrical circuit substrate including a first side; providing a heat sink including a metal base plate having a first side and a second side, and a plurality of fins extending from the second side; and adhesively bonding at least a portion of the first side of the electrical circuit substrate directly with the first side of the base plate using a thermally conductive and electrically insulating adhesive.

DETAILED DESCRIPTION OF THE INVENTION

Figure 1:
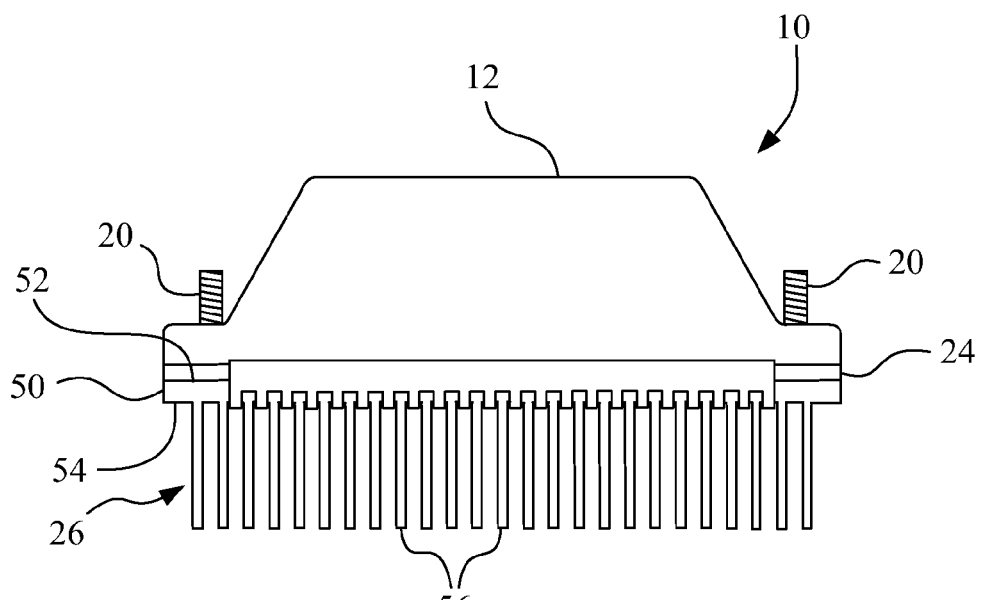
FIG. 1 is a plan view of an embodiment of an electronic control module of the present invention.
Figure 2:
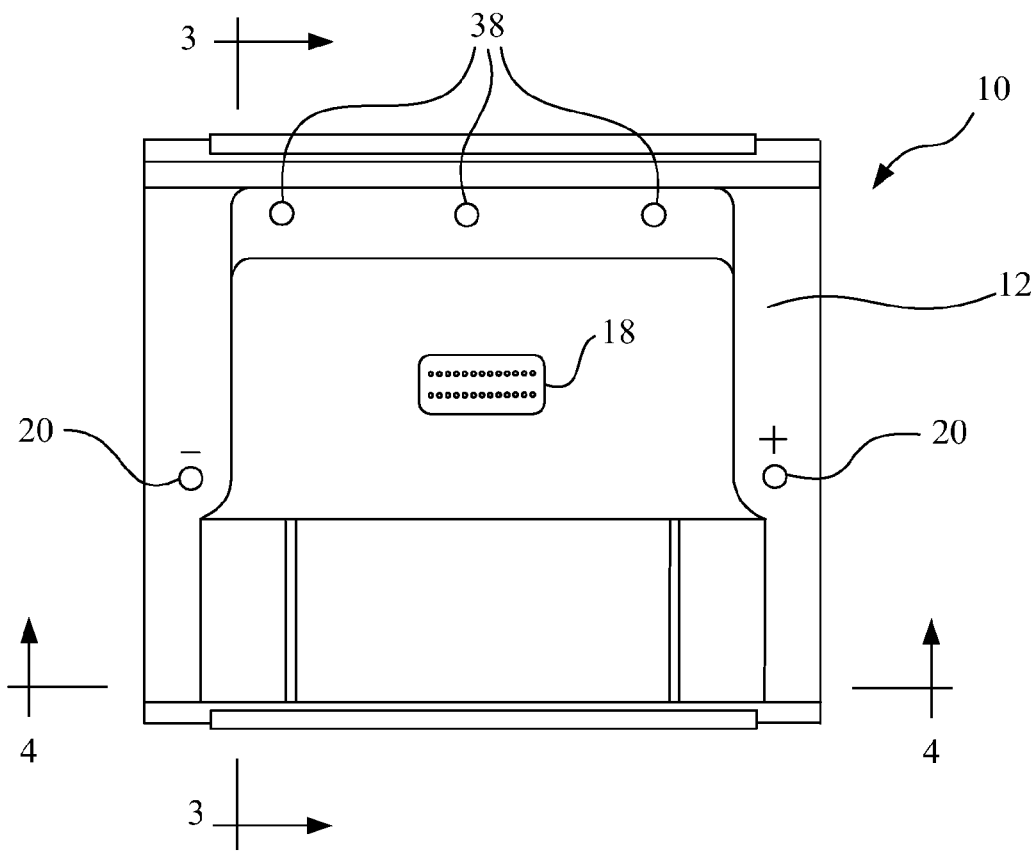
FIG. 2 is a top view of the electronic control module of FIG. 1.

Referring now to the drawings, and more particularly to FIGS. 1-4, there is shown an embodiment of an electronic control module (ECM) 10 of the present invention. ECM 10 is used for high-current electric drive applications, such as a reel motor on a cutting platform of an agricultural combine or a traction motor for a work machine.

ECM 10 generally includes a housing 12, a control board 14 and an electrical circuit assembly 16. Housing 12 may be of any suitable configuration, and may be formed from any suitable material such as plastic or metal. Housing 12 carries control board 14, and provides external access to an input/output (I/O) connector 18 which is electrically connected with control board 14. Housing 12 also carries and provides access to a pair of input power terminals 20 which are electrically coupled with electrical circuit assembly 16. A flexible jumper circuit 22 interconnects control board 14 with electrical circuit assembly 16. Alternatively, control board 14 may be coupled with electrical circuit assembly 16 using suitable electrical connectors, such as a single inline or dual inline type connector.

Electrical circuit assembly 16 generally includes an electrical circuit substrate 24, heat sink 26, and an adhesive 28. An electrical circuit substrate refers to a dielectric layer (e.g., generally planar board or flexible membrane) or portion that supports or is associated with electrically conductive traces. One example of an electrical circuit substrate is an electrical circuit in which thin metallic traces (typically copper, but any appropriate electrically-conductive material) are layered with a thin flexible substrate material, such as polyamide (a "flexible electrical circuit substrate" or "flexible circuit"). Another example of an electrical circuit substrate is an electrical circuit in which thin metallic traces are layered with a rigid substrate material, such as a glass reinforced laminate such as FR4 (a "rigid electrical circuit substrate" or "rigid circuit"). Electrical circuit substrate 24 includes a first side 30 and a second side 32. First side 30 is adhered to heat sink 26 using adhesive 28, as will be described below. Second side 32 carries a plurality of electrical components, such as input power terminals 20, power components 34, capacitors 36 and output power connectors 38. In the embodiment shown, power components 34 are in the form of field effect transistors (FETs) which typically dissipate an appreciable amount of heat during operation. Capacitors 36 may be of any suitable configuration, depending upon the application, and in the embodiment shown are configured as 22 mm diameter by 41 mm length capacitors which are electrically coupled with electrical circuit substrate 24. Output power connectors 38 may also be suitably configured depending upon the application, and are configured as threaded studs in the embodiment shown in FIGS. 1-4 (three studs for a 3-phase motor).

Figure 3:
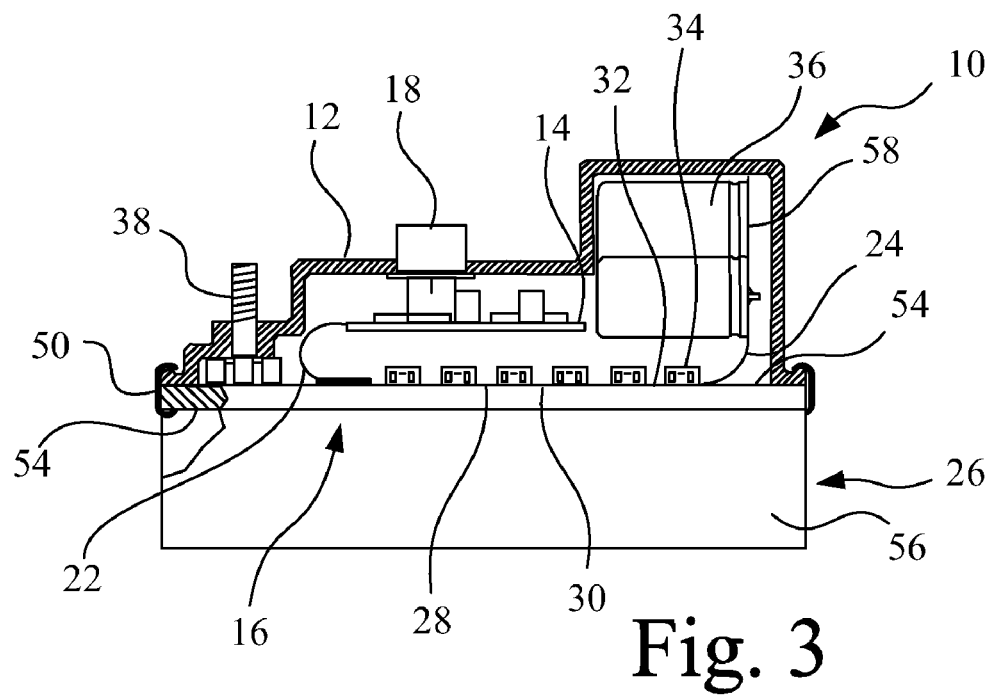
FIG. 3 is a side, sectional view of the electronic control module of FIGS. 1 and 2, taken along line 3-3 in FIG. 2.
Figure 4:
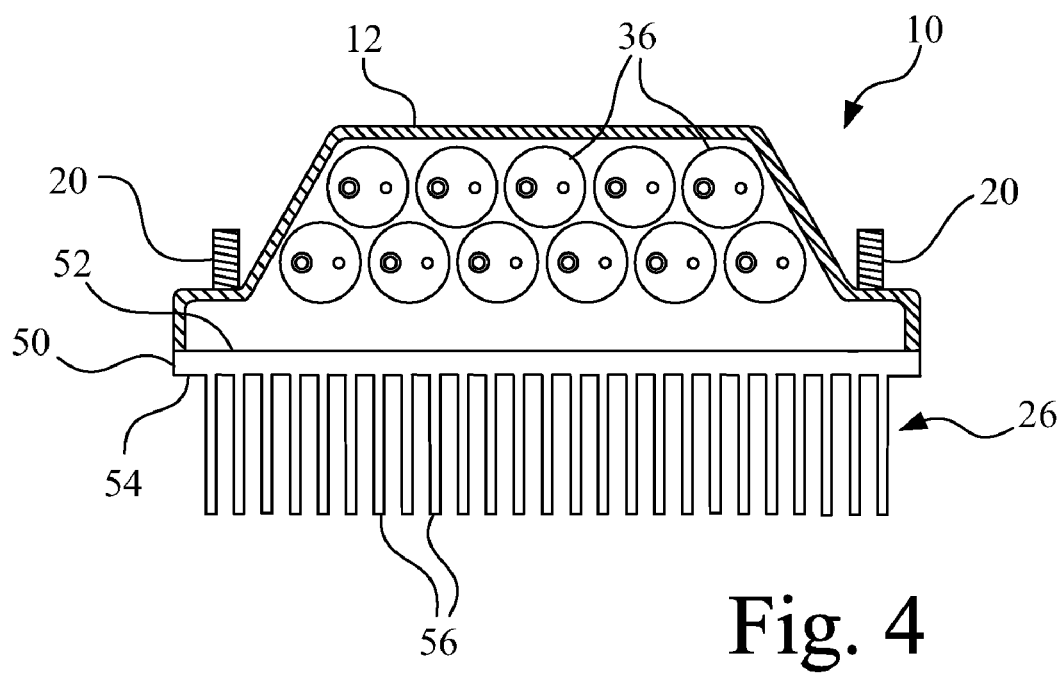
FIG. 4 is an end, sectional view of the electronic control module of FIGS. 1 and 2, taken along line 4-4 in FIG. 2.
Figure 5:
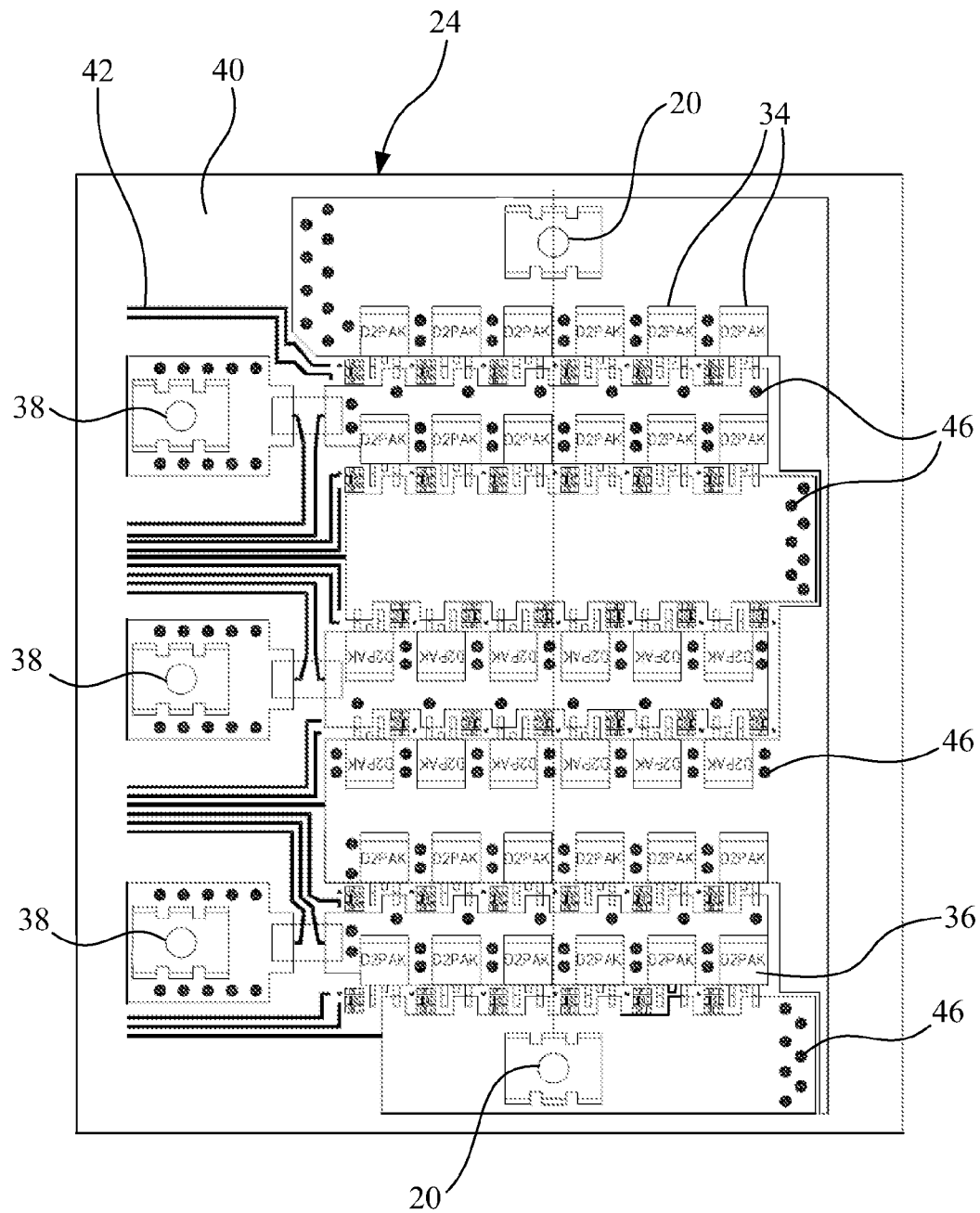
FIG. 5 is a top view of the electrical circuit substrate used in the electronic control module of FIGS. 1-4.
Figure 6:
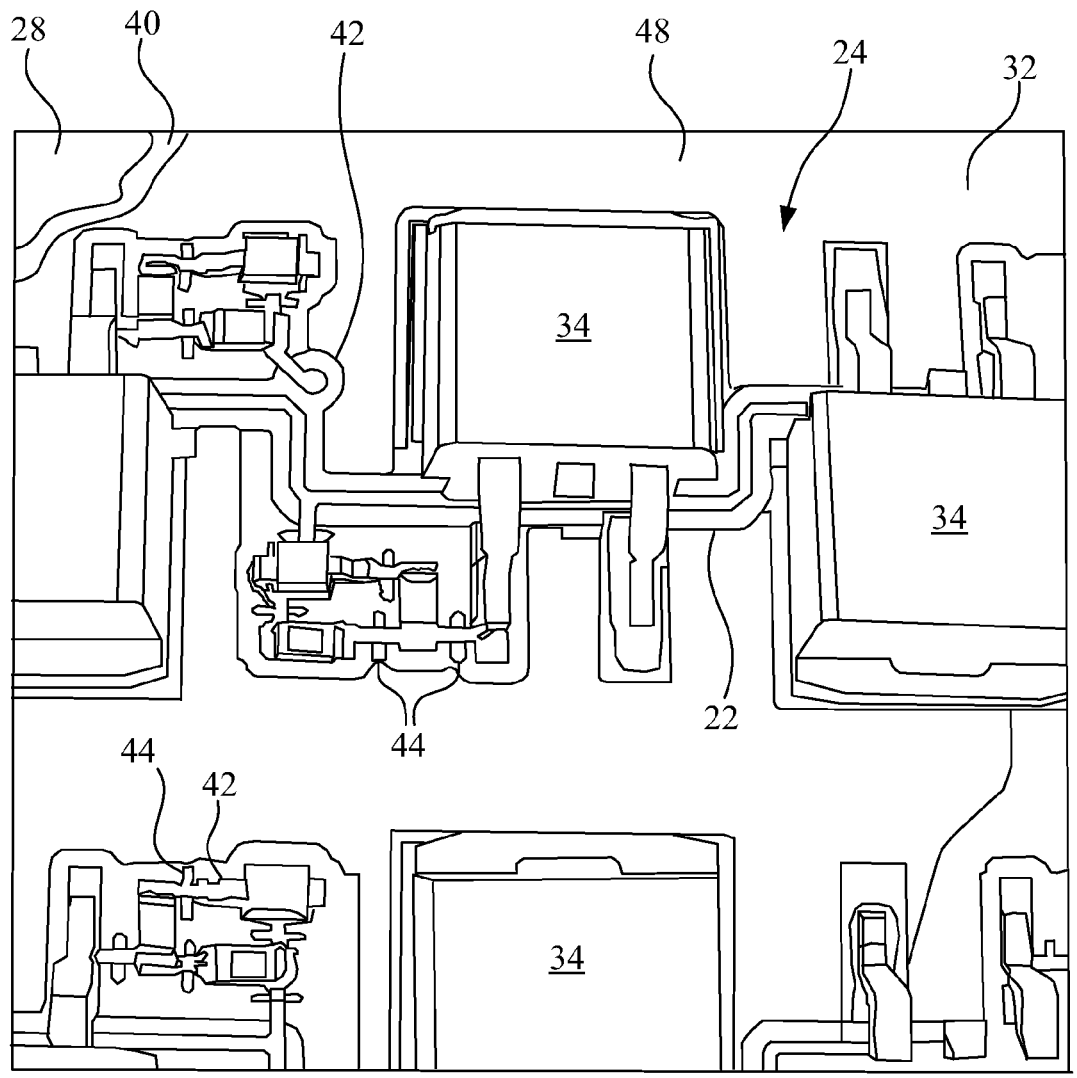
FIG. 6 is a more detailed top view of a portion of the electrical circuit substrate shown in FIG. 5.

In the embodiment shown in FIGS. 3, 5 and 6, the electrical circuit substrate 24 is a flexible circuit constructed with multiple layers which provide a desired degree of flexibility. More particularly, electrical circuit substrate 24 includes a flexible substrate 40 and a plurality of copper traces 42 on at least one side of substrate 40. Solder dams 44 may be provided at selected locations to prevent a flow of solder into unwanted areas on electrical circuit substrate 24. Solder dams 44 are silk screened onto electrical circuit substrate 24, with each solder dam 44 extending across a corresponding one of copper traces 42, as shown in more detail in FIG. 6. Flexible substrate 40 is in the form of a polyimide substrate in the embodiment shown, but may also be constructed from a different flexible material depending upon the application (the upper, left corner of electrical circuit substrate 24 is shown layered in FIG. 6 to illustrate substrate 40 and adhesive 28).

Power components 34, capacitors 36 and power connectors 38 are preferably each configured as surface mount components, providing quick and easy soldering with corresponding pads (not numbered) associated with copper traces 42 using a "pick-and-place" machine.

Electrical circuit substrate 24 may optionally also include one or more thermal vias 46 extending through electrical circuit substrate 24 from first side 30 to second side 32. Each thermal via 46 is in the form of a plated hole (i.e., a metal filled hole) positioned under a corresponding power component 34 for better conducting heat away from electrical circuit substrate 24.

Additionally, electrical circuit substrate 24 may optionally include a solder mask 48 (FIG. 6) on second side 32 away from heat sink 26. A solder mask is not provided on first side 30 of electrical circuit substrate 24 since it is desired to maximize heat transfer to heat sink 26. A solder mask typically interferes with heat transfer, and thus is not provided on first side 30.

Heat sink 26 includes a metal base plate 50 having a first side 52 and a second side 54. A plurality of heat conducting fins 56 extend from second side 54. Fins 56 can be coupled with base plate 50 in a number of suitable ways, such as welding, bending, etc. Fins 56 are preferably formed as an integral unit with base plate 50, such that heat sink 26 is of monolithic construction. Heat sink 26, including base plate 50 and fins 56, is also preferably formed from aluminum with a sufficient heat conducting coefficient, but may be formed from a different type of material depending upon the application.

Adhesive 28 is a thermally conductive and electrically insulating adhesive which directly interconnects at least a portion of first side 30 of electrical circuit substrate 24 with first side 52 of base plate 50. In one embodiment, adhesive 28 is a pressure sensitive adhesive (PSA) which thermally couples and electrically isolates electrical circuit substrate 24 and base plate 50. For example, adhesive 28 may be in the form of a 2-5 mm thick ceramic based PSA which is used to couple electrical circuit substrate 24 with base plate 50. Other types of adhesives may also be used, such as a prepreg material which is die cut to size (a prepreg material is basically a fiberglass cloth impregnated with a resin which may be cut, placed and cured for adhesive bonding). An example of a prepreg material is Isola 1060 no-flow prepreg.

In the embodiment shown in FIGS. 1-5, electrical circuit substrate 24 includes a first end 58 which is bent away from heat sink 26 at approximately a 90° angle. First end 58 carries the plurality of capacitors 36, and is not adhesively bonded with heat sink 26. Capacitors 36 are through-hole components, rather than SMT components, and bending electrical circuit substrate 24 away from heat sink 26 allows soldering of the through-hole leads extending from capacitors 36. Since FETs 34 are the primary source of heat generated during operation, this still allows ample heat conduction away from electrical circuit substrate 24.

As another option, heat sink 26 may be formed with a pocket (not shown) in base plate 50 beneath a portion of electrical circuit substrate 24 carrying through-hole components, and the leads from the through-hole components may be received within the pocket.

As a further option, electrical circuit substrate 24 can be configured as a rigid board for some applications, which is still nonetheless adhesively bonded directly to heat sink 26 using an appropriate thermally conductive and electrically insulating adhesive 28.

During manufacture, electrical circuit substrate 24 is formed with a suitable trace configuration, and placed on heat sink 26. Locating pins or the like can optionally be used for accurate placement of electrical circuit substrate 24 on heat sink 26. Electrical circuit substrate 24 is adhered to heat sink 26 using a PSA or other suitable adhesive material or technology. The electrical components, including FETs 34, capacitors 36 and power connectors 38, are accurately placed onto electrical circuit substrate 24, preferably using an automated process such as a pick-and-place machine. The assembly is then passed through a solder reflow stage to electrically and mechanically couple the electrical components with electrical circuit substrate 24.

Figure 7:
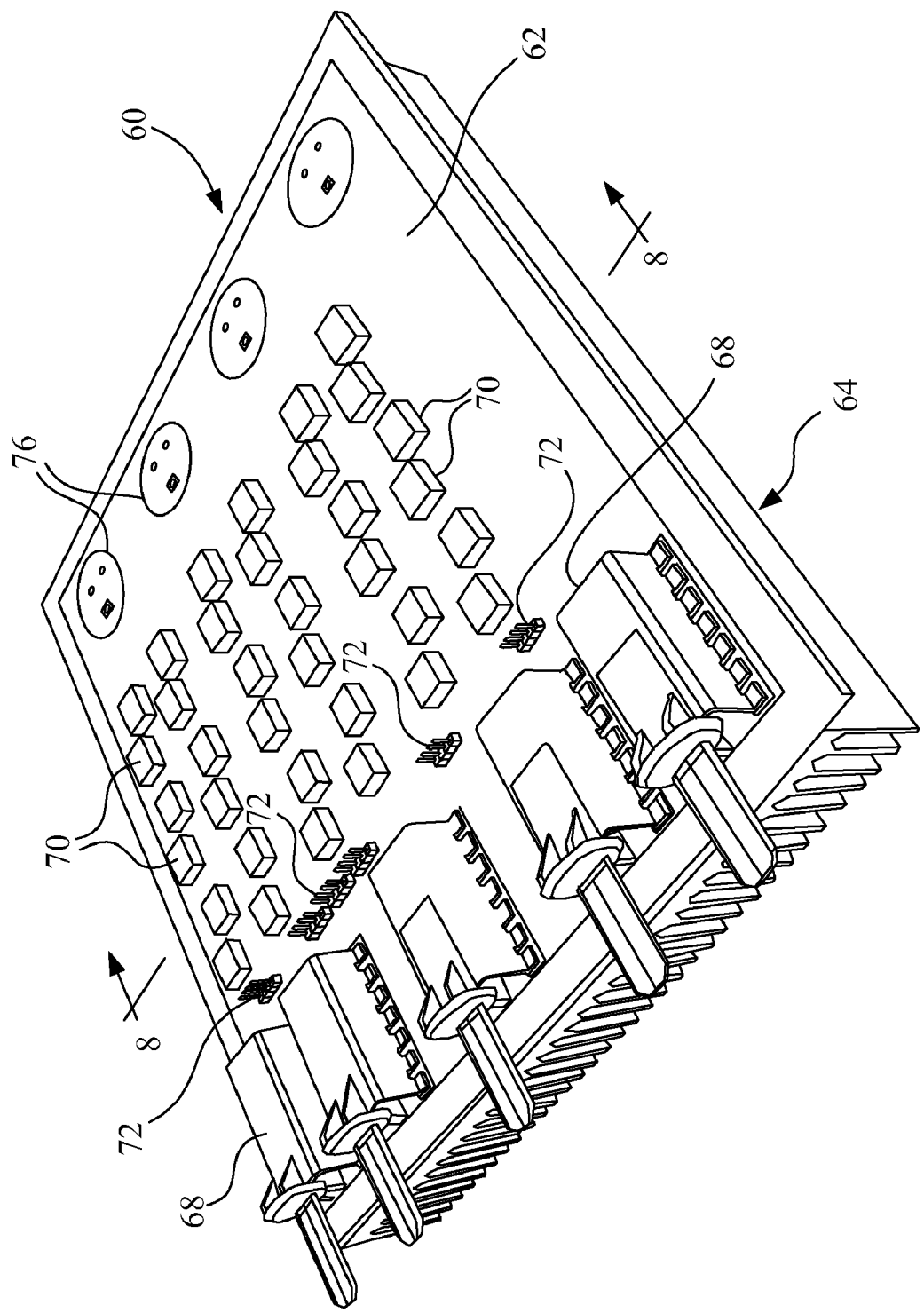
FIG. 7 is a perspective view of another embodiment of an electrical circuit assembly of the present invention.
Figure 8:
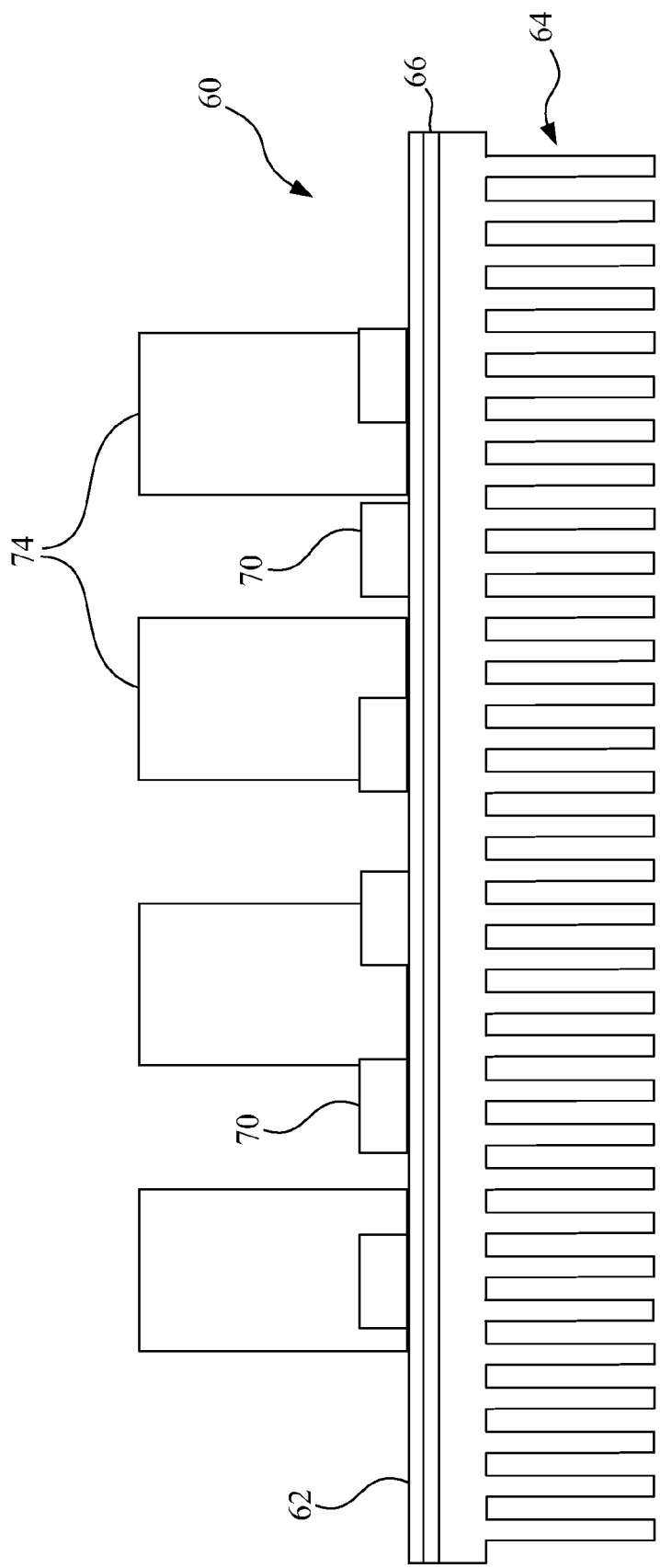
FIG. 8 is a side, sectional view of the electrical circuit assembly of FIG. 7, taken along line 8-8 in FIG. 7.

Referring now to FIGS. 7 and 8, there is shown another embodiment of an electrical circuit assembly 60 of the present invention which may be used within an ECM or other high-current electrical module. Similar to electrical circuit assembly 16, electrical circuit assembly 60 includes a electrical circuit substrate 62, heat sink 64 and adhesive 66. Electrical circuit substrate 62 is likewise directly adhesively bonded to the flat side of heat sink 64 using adhesive 66. The primary difference between electrical circuit assembly 16 and electrical circuit assembly 60 is the layout of the electrical components on electrical circuit substrate 62, namely single blade type power connectors 68, FETs 70, signal connectors 72 to a control board (not shown), and a plurality of capacitors 74 (shown in FIG. 8, with mounting locations 76 shown in FIG. 7). In this embodiment, the end of electrical circuit substrate 62 carrying capacitors 74 is also adhesively bonded to heat sink 64, rather than being flexed at a 90 degree angle as shown in FIG. 3.

According to the present invention described above, a electrical circuit substrate is used to connect the power devices, heat sink, bus capacitors, bus structure, external power connectors, signal interconnect, and enclosure. The electrical circuit substrate is bonded directly to the flat side of a large, finned metal heat sink using a PSA or other adhesion method. The PSA acts as a thermal conductor (to help draw heat out of the circuit toward the heat sink) and is also an electrical insulator, effectively isolating the electrical circuit from the metal heat sink. The PSA does not require heat curing, as does the dielectric layer in IMST.

The present invention maximizes heat transfer out of the module and therefore allows for the use of smaller, less expensive, surface mount components that can be placed by automated manufacturing pick-and-place machines. (Even though a larger number of these smaller, surface mount devices are needed for high-power applications, in comparison to the larger through-hole versions, they are considerably cheaper and easier to manufacture than the larger versions.) Traditional solutions require larger components, some of which need to be manually inserted or placed through a separate machine or process.

The electrical circuit assembly of the present invention provides two major benefits, namely, 1) simplification of the manufacturing process, and 2) improved conduction of heat away from the high-power circuitry. To reduce the complexity of the design and automate the process, the structure of the module (including the high-power electronics) is interconnected with a electrical circuit substrate. This allows the entire unit to be manufactured on a conventional, high-throughput manufacturing line, and eliminates processes needed for traditional circuits.

Because the electrical circuit substrate is bonded directly to a single-piece finned heat sink, several mechanical components (separate heat sink, screws, clips, etc.) found in traditional heat sink designs can be eliminated. The electrical circuit substrate is directly bonded to a single-piece finned aluminum (or other metal) heat sink using a PSA or other bonding technology. Conventional designs require that the circuit layer be bonded to a flat metal plate, which is in turn connected to a separate finned heat sink to maximize heat conduction. The present invention eliminates the flat metal plate and bonds the electrical circuit substrate directly to a flat side of the finned heat sink. This elimination of an additional external interface increases the thermal conductivity (i.e., improves heat dissipation) for the ECM.

Traditional solutions, such as the IMST technology described above, require a dielectric material or other thin material to be placed between the circuit and the metal surface to which it is to be connected. This dielectric material is a ceramic and must be heat cured, adding an additional process to the manufacture of the module. The present invention eliminates this intermediate layer and bonds the electrical circuit substrate directly to the finned heat sink with a PSA (or other adhesion material or technique).

The present invention eliminates the need for a solder mask material to be used on the end product. A solder mask is used in traditional circuits to keep solder from flowing into sensitive areas of the circuit and causing unwanted electrical connections between traces. However, a solder mask can impede the flow of heat energy out of the circuit. Solder masking is eliminated from the present invention since the electrical circuit substrate does not contain components on the bottom side, which is bonded directly to the finned heat sink. A solder mask is not required on this side and the elimination of the solder mask provides better thermal conduction.

Instead of a solder mask on the topside of the circuit, ink dams (that is, lines placed on and across the circuit traces via a silk screen method) are used to keep solder from flowing into areas on the circuit where it is not wanted. The solder dams are formed with a silkscreen process to "paint" lines on the electrical circuit substrate to prevent solder from flowing into areas where it is not wanted. Silk-screening is a much less expensive process than the application of a solder mask, which reduces product cost and complexity.

Thermal vias (plated holes that pass through the entire electrical circuit substrate to conduct heat to the heat sink) are also used near and under high-power electronics to further improve heat conduction.

The use of a flexible electrical circuit substrate, instead of a rigid electrical circuit substrate, allows for an intrinsic low-inductance bus structure. By its nature, a flexible circuit uses thin copper traces and thin board layers. This arrangement minimizes the amount of inductance present on the circuit traces. The lower the inductance present in the circuit, the better the circuit is able to handle voltage spikes and supply the in-rush current needed in start-up situations.

Having described the preferred embodiment, it will become apparent that various modifications can be made without departing from the scope of the invention as defined in the accompanying claims.

The invention claimed is:

1. An electrical circuit assembly, comprising:
  an electrical circuit substrate including a first side and a second side, a plurality of electrical components on and only extending above the second side, the electrical circuit substrate comprising a dielectric layer that is associated with conductive traces on at least one of the sides of the substrate;
  a finned heat sink including an integral metal base plate portion having a first side and a second side, the first side of the heat sink having a flat or generally planar surface and a plurality of fins extending from said second side;
  a thermally conductive and electrically insulating adhesive directly interconnecting at least a portion of said first side of said electrical circuit substrate with said first side of said base plate of the heat sink, the adhesive comprising a fiberglass cloth impregnated with a resin for adhesive bonding directly between the electrical circuit substrate and the heat sink to facilitate heat dissipation from the assembly, where the adhesive bonds to the dielectric layer of the electrical circuit substrate;

a housing having a recessed side for receiving the electric components and overlying at least a perimeter of the electrical circuit substrate to enclose the electric components between the electric circuit substrate and the housing; and a conductive post extending through an opening in the housing, the conductive post comprising a power terminal electrically coupled to the electrical circuit substrate.

2. The electrical circuit assembly of claim 1, wherein the adhesive contacts or adheres to the electrical circuit substrate, comprising the dielectric material, and the base plate prior to a solder reflow stage for electrically and mechanically coupling the components to the electrical circuit substrate.

3. The electrical circuit assembly of claim 1, wherein said electrical circuit substrate includes a plurality of copper traces on at least one side of said substrate.

4. The electrical circuit assembly of claim 3, further including a plurality of solder dams, each said solder dam extending across a corresponding one of said copper traces.

5. The electrical circuit assembly of claim 1, wherein said electrical circuit substrate includes at least one thermal via extending from said first side to said second side, each said thermal via comprising a plated hole associated with one of said electrical components.

6. The electrical circuit assembly of claim 1, wherein said heat sink is an aluminum heat sink of monolithic construction.

7. The electrical circuit assembly of claim 1, wherein said electrical circuit substrate has an absence of a solder mask on said first side, thereby enhancing thermal conductivity to said adhesive.

8. The electrical circuit assembly of claim 1, wherein said adhesive comprises a prepreg material.

9. An electronic control module, comprising;

a housing;

a control board within said housing; and an electrical circuit assembly mounted to said housing, said electrical circuit assembly including:

an electrical circuit substrate connected with said control board, said electrical circuit substrate including a first side and a second side, a plurality of electrical components on and only extending above the second side, the electrical circuit substrate comprising a dielectric layer that is associated with conductive traces on at least one of the sides of the substrate;

a finned heat sink including an integral metal base plate portion having a first side and a second side, the first side of the heat sink having a flat or generally planar surface and a plurality of fins extending from said second side;

a thermally conductive and electrically insulating adhesive directly interconnecting at least a portion of said first side of said electrical circuit substrate with said first side of said base plate of the heat sink, the adhesive comprising a fiberglass cloth impregnated with a resin for adhesive bonding directly between the electrical circuit substrate and the heat sink to facilitate heat dissipation from the electronic control module, where the adhesive bonds to the dielectric layer of the electrical circuit substrate;

a housing having a recessed side for receiving the electric components and overlying at least a perimeter of the electrical circuit substrate to enclose the electric components between the electric circuit substrate and the housing; and a conductive post extending through an opening in the housing, the conductive post comprising a power terminal electrically coupled to the electrical circuit substrate.

10. The electronic control module of claim 9, wherein the adhesive contacts or adheres to the electrical circuit substrate, comprising the dielectric material, and the base plate prior to a solder reflow stage for electrically and mechanically coupling the components to the electrical circuit substrate.

11. The electronic control module of claim 9, wherein said electrical circuit substrate includes a plurality of copper traces on at least one side of said substrate.

12. The electronic control module of claim 11, further including a plurality of solder dams, each said solder dam extending across a corresponding one of said copper traces.

13. The electronic control module of claim 9, wherein said electrical circuit substrate includes at least one thermal via extending from said first side to said second side, each said thermal via comprising a plated hole associated with one of said electrical components.

14. The electronic control module of claim 9, wherein said heat sink is an aluminum heat sink of monolithic construction.

15. The electronic control module of claim 9, wherein said adhesive comprises a pressure sensitive adhesive.

16. The electronic control module of claim 9, wherein said electrical circuit substrate has an absence of a solder mask on said first side, thereby enhancing thermal conductivity to said adhesive.

17. The electronic control module of claim 9, wherein said adhesive comprises a prepreg material.

18. A method of manufacturing an electrical circuit assembly, comprising the steps of:

providing an electrical circuit substrate including a first side, the electrical circuit substrate comprising a dielectric layer that is associated with conductive traces on at least one of the sides of the substrate;

placing components on the electrical circuit substrate;

providing a heat sink including a metal base plate having a first side and a second side, the first side of the heat sink having a flat or generally planar surface and a plurality of fins extending from said second side;

adhesively bonding at least a portion of said first side of said electrical circuit substrate directly with said first side of said base plate using a thermally conductive and electrically insulating adhesive, the adhesive comprising a fiberglass cloth impregnated with a resin for adhesive bonding directly between the electrical circuit substrate and the heat sink to facilitate heat dissipation from the assembly, where the adhesive contacts or adheres to the electrical circuit substrate and the base plate prior to a solder reflow stage for electrically and mechanically coupling the components to the electrical circuit, and passing the assembly through the solder reflow stage to electrically and mechanically couple the components to the electrical circuit substrate and to cure the resin for bonding the electrical circuit substrate to the heat sink.

19. The method of manufacturing an electrical circuit assembly of claim 18, wherein said electrical circuit substrate includes a plurality of copper traces on at least one side of said substrate, and further including the step of applying a plurality of solder dams to said electrical circuit substrate, each said solder dam extending across a corresponding one of said copper traces.

20. The method of manufacturing an electrical circuit assembly of claim 18, wherein said adhesively bonding step is carried out using a prepreg material.

\* \* \* \* \*